United States Patent [19]

Yamazaki et al.

[11] 3,719,892

[45] March 6, 1973

[54] TRANSISTOR RADIO RECEIVER EMPLOYING AN IMPROVED SQUELCH CIRCUIT

[75] Inventors: Seishi Yamazaki; Masao Kaneda, both of Katsuta, Japan

[73] Assignee: Hitachi, Ltd., Tokyo, Japan

[22] Filed: Aug. 4, 1970

[21] Appl. No.: 60,843

[52] U.S. Cl. ....................325/402, 325/419, 325/478

[51] Int. Cl. ................................................H04b 1/10

[58] Field of Search......325/319, 402, 403, 478, 318; 330/51

[56] References Cited

UNITED STATES PATENTS

| | | | |
|---|---|---|---|
| 3,056,086 | 9/1962 | Brauner | 325/319 |
| 3,038,072 | 5/1962 | Proudfit | 325/319 |
| 3,011,052 | 11/1961 | Busby | 325/319 |
| 3,328,695 | 6/1967 | Ruthenberg | 325/478 X |
| 3,584,304 | 6/1971 | Casterline | 325/478 |

*Primary Examiner*—Benedict V. Safourek
*Attorney*—Craig, Antonelli & Hill

[57] ABSTRACT

In a transistor radio receiver, two time constant resistors, one of which is a variable resistor, are connected in series via a signal detection circuit to a power source and a time constant capacitor is connected to the junction point of the two resistors to form therewith an automatic gain control voltage generating circuit, and a squelch transistor whose base is connected to the movable terminal of a potentiometer, so that the squelch transistor which is normally biased to be conductive is quickly cut-off in response to even a weak signal input to the receiver.

11 Claims, 5 Drawing Figures

INVENTORS
SEISHI YAMAZAKI AND MASAO KANEDA

BY Craig, Antonelli, Stewart & Hill
ATTORNEYS

INVENTORS

SEISHI YAMAZAKI AND MASAO KANEDA

BY Craig, Antonelli, Stewart & Hill

ATTORNEYS

TRANSISTOR RADIO RECEIVER EMPLOYING AN IMPROVED SQUELCH CIRCUIT

The present invention relates to a transistor radio receiver provided with an improved squelch circuit.

As is generally known, a squelch circuit serves to suppress the output of the audio amplifying stage when no signal is received, and to permit said stage to operate normally at the time of a signal input, in order to prevent the amplification and output of useless noise which increases at the time of a non-signal input.

Such squelch circuits have been proposed in various ways but the construction of these circuits is complicated, and they generally suffer from a lack of sensitivity at low signal levels. For example, if there is a small or weak voice signal input having power less than a certain value, the conventional squelch circuit will generally not recognize this signal, and accordingly will continue to perform its squelch function with the result that the voice signal is not amplified, but is cut off as if it were a noise at the time of a non-signal input.

An object of the present invention is to provide an improved squelch circuit which is much more sensitive at low signal levels.

Another object of the present invention is to provide an improved squelch circuit which is capable of releasing its squelch function in response to receipt of even a very weak signal input.

A further object of the present invention is to provide an improved squelch circuit which is relatively simple in construction and therefore simple and economical to manufacture.

Generally a radio receiver includes a high frequency signal amplifying circuit stage for amplifying a high frequency carrier wave, on which is superimposed an audio frequency signal to be detected, a converter for converting the carrier wave into an intermediate frequency signal, an intermediate frequency signal amplifying circuit stage, a detector or signal detection circuit stage for separating the audio frequency signal from the carrier, and an audio frequency signal amplifying circuit stage. In such a receiver, it has been noted that the audio frequency signal which is detected by the detection circuit in response to application of an input signal to the receiver is changed to a significant extent upon receipt of a very weak signal input, as compared to the non-signal condition. In accordance with the present invention, this voltage change which is produced by receipt of a signal input is utilized to control the action of the squelch circuit.

The signal detection circuit of a standard radio receiver consists of a diode coupled to an intermediate frequency transformer, and the combination of a resistor and a capacitor connected to the diode. This circuit generates a negative D.C. output voltage, at the time of a non-signal condition, corresponding to the voltage drop (usually about 0.1V) across the diode with the same polarity referenced to ground, while a positive D.C. output voltage is generated when an input is applied to the receiver. As a result, there is generated in such a circuit an output voltage having a polarity which can be used to erase the output voltage from the audio amplifier at the time of a non-signal condition. Therefore, in accordance with the invention the output voltage from the signal detection circuit at the time of this non-signal input is used to generate a bias voltage; the squelch circuit is biased with this bias voltage; and, since the polarity of the bias voltage changes upon receipt of an input to the receiver, the bias voltage performs the squelch action on said squelch circuit only at the time an output voltage value is generated from the audio amplifier during a non-signal input condition.

These and other objects, features and advantages of the present invention will become more apparent from the following detailed description thereof, when taken in conjunction with the accompanying drawings which illustrate two embodiments of the present invention, and wherein.

Figure 1:
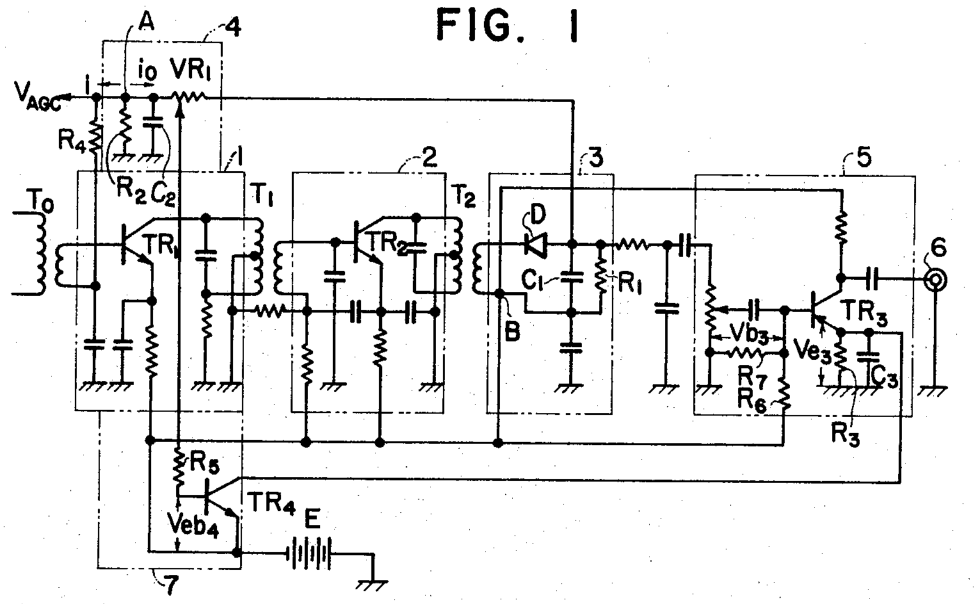
FIGS. 1 and 2 are schematic circuit diagrams of a transistor receiver to which is applied the squelch circuit according to the present invention.

Referring first to FIG. 1, stage 1 is an intermediate frequency amplifier circuit, the amplification factor of which is changed by an automatic gain control voltage (AGC) applied to the input thereof. The next stage 2 is a second intermediate frequency amplifier circuit coupled to the circuit in stage 1. To the base of a transistor $TR_1$ of the first stage intermediate frequency amplifier circuit 1, there is supplied for amplification an input signal converted to an intermediate frequency by a frequency converting circuit (not shown) through a transformer $T_0$. The output of the transistor $TR_1$ is supplied for amplification to a transistor $TR_2$ of the second stage intermediate frequency circuit 2 through transformer $T_1$, and the output of the transistor $TR_2$ is supplied to a detection diode D in a detection circuit 3 via transformer $T_2$.

The detection output of the diode D is applied for rectification to a parallel circuit consisting of a capacitor $C_1$ and a resistor $R_1$, and the detected output is also supplied to a time constant circuit 4 in which the voltage is divided by the potentiometer $VR_1$ and a resistor $R_2$, so that the AGC voltage $V_{AGC}$ is obtained across the capacitor $C_2$. Further the end B of the transformer $T_2$ is connected to a negative terminal of the power source E.

An audio frequency output detected by the diode D after being rectified by the resistor $R_1$ and capacitor $C_1$, is supplied for amplification to a transistor $TR_3$ in the audio frequency amplifier circuit 5, and the amplified output thereof is supplied to a following audio frequency amplifier circuit (not shown) from the output terminal 6. The negative terminal of power source E is connected through the voltage dividing combination of resistors $R_6$ and $R_7$ to bias the base of transistor $TR_3$.

A squelch circuit 7 according to the present invention includes a transistor $TR_4$ having its collector connected to the emitter of the transistor $TR_3$ of the audio frequency amplifier circuit 5, the base of transistor $TR_3$ being connected to the movable contact of the potentiometer $VR_1$ of the time constant circuit 4 through the resistor $R_5$ and the emitter being connected to the negative terminal of the power source E. The transistor $TR_3$ for amplifying the audio frequency signal is a PNP-type germanium transistor and the emitter is grounded through the parallel circuit of the resistor $R_3$ and the capacitor $C_3$. As for the other transistors $TR_1$, $TR_2$ and $TR_4$, an NPN-type silicon transistor is used. The positive terminal of the power source E is grounded. The AGC voltage is supplied to the base of the transistor $TR_1$ of the first stage intermediate frequency amplifier circuit 1 through the resistor $R_4$ and the secondary coil of the transformer $T_0$. The other circuit constructions exclusive of the squelch circuit are well known, so that their operation should be understood without further explanation.

The present invention is characterized in that the potentiometer $VR_1$ is used as a resistance in the time constant circuit 4 and a squelch ON-OFF voltage for control of the squelch transistor $TR_4$ is provided by adjusting the movable contact of the potentiometer $VR_1$ to provide a proper bias for the squelch transistor. Accordingly, the circuit construction of the invention is quite simple and the ON-OFF control of the squelch operation is very sensitive.

Figure 3:
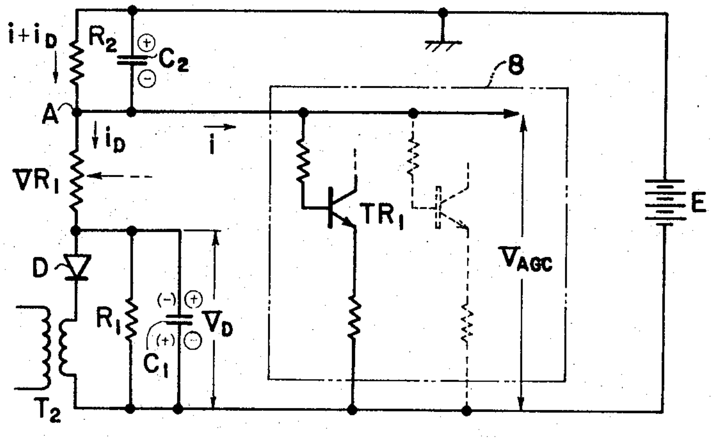
FIGS. 3 to 5 are equivalent circuit diagrams illustrating the operating principles of the present invention.
Figure 4:
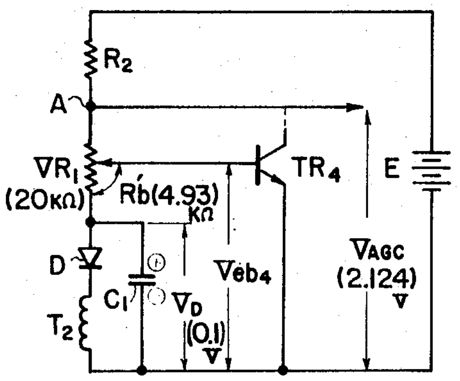

The advantageous features of the present invention will become more clear from the following detailed explanation of the operation of the circuit of FIG. 1. When the transistor $TR_1$ is receiving no signal, no signal will be applied to the detection circuit 3, so that as shown in FIG. 3, the diode D is biased conductive by the electric power source E through the resistor $R_2$, the variable resistor $VR_1$ of the time constant circuit 4 and the secondary coil of the transformer $T_2$. Therefore, the capacitor $C_1$ will be positively charged with reference to the negative terminal of the power source E (shown by ⊕ and ⊖ in the figures) to a voltage corresponding to the voltage drop (about 0.1 V) across the diode in its conducting state, thereby providing the voltage $V_D$. However, the capacitor $C_2$ is negatively charged with reference to ground (shown by ⊕ and ⊖ in the figure) to a voltage corresponding to the voltage drop across the resistor $R_2$; therefore, the AGC voltage $V_{AGC}$ is positively provided with reference to the negative terminal of the power source E.

The positive AGC voltage $V_{AGC}$ referenced to the negative terminal of the power source E is obtained by subtraction of the voltage across the capacitor $C_2$ from the voltage $V_E$ of the power source, so that when this voltage $V_{AGC}$ is supplied to the transistor $TR_1$, it becomes a forward bias. A base current therefore flows by means of this forward bias into the resistor $TR_1$ and the transistor or transistors (shown in dotted line) are also supplied with this AGC voltage. The total amount of the respective base currents flowing through the transistors is designated $i$, while the current flowing through the variable resistors $VR_1$ is designated $i_D$. These currents $i$ and $i_D$ in combination flow through the resistor $R_2$.

By observing from the point A to the right in FIG. 3, the circuit 8 including the transistor $TR_1$ and subsequent transistors receive the AGC voltage. Assuming now an equivalent resistance for the circuit 8 of $R_a$, a resistance value for the potentiometer $VR_1$ of $R_b$ and a resistance value for the resistor $R_2$ of $R_c$, then the AGC voltage is expressed by the following equation:

$$V_{AGC}=\frac{V_E}{1+\frac{R_c}{R_b}+\frac{R_c}{R_a}}+\frac{V_D}{1+\frac{R_b}{R_c}+\frac{R_b}{R_a}} \qquad (1)$$

If a signal input is supplied to the transistor $TR_1$, the diode D performs a well-known detection function, and the detection output is applied to the capacitor $C_1$. This detection output charges the capacitor $C_1$ this time in the negative direction (as shown by (−) and (+) in FIG. 3) with respect to the negative terminal of the power source and this charge across the capacitor $C_1$ increases with the increase of the applied input signal, so that it produces an inversion in the polarity of the voltage $V_D$ across the capacitor. Accordingly, $V_{AGC}$ decreases.

When $R_b = 20$ KΩ, $R_c = 56$ KΩ and $V_E = 9$ V, and the values of $R_a$ = 100 KΩ and 50 KΩ, respectively, the values of the $V_{AGC}$, which decreases in response to decrease in the voltage $V_D$ caused by the increase of the input signal, as calculated by the Equation (1) are as follows:

| $V_D$ | $V_{AGC}$ ($R_a$ = 100 KΩ) | $V_{AGC}$ ($R_a$ = 50 KΩ) |
|---|---|---|
| +0.1 V | +2.124 V | +2.0 V |
| 0 | +2.06 | +1.95 |
| −0.5 | +1.739 | +1.665 |
| −1.0 | +1.417 | +1.38 |
| −2.0 | +0.775 | +0.81 |
| −3.0 | +0.13 | +0.24 |
| −4.0 | −0.51 | −0.33 |

As described above, the present invention is designed to sensitively actuate the squelch transistor $TR_4$ in response to slight changes of the AGC voltage, which in turn is responsive to the amplitude of the input signal. Such control is attained by connecting the base of the transistor $TR_4$ through the resistor $R_5$ to the movable contact of the potentiometer $VR_1$ of the AGC time constant circuit 4, while the emitter of the transistor is connected to the negative terminal of the power source E.

As the squelch transistor $TR_4$, a Hitachi silicon NPN-type transistor 2SC 458 is preferably used. Its conductive threshold voltage is 0.6 V, so that the circuit is adjusted to provide 0.6 V (preferably 0.68 V) as a bias voltage $V_{eb4}$ between the emitter and the base of the transistor $TR_4$ at the time of non-signal input. This critical bias is obtained by adjusting the movable contact of the potentiometer $VR_1$.

Supposing that the equivalent resistance value $R_a$ of the circuit 8 in FIG. 3 is 100 KΩ, as shown in the figure, a detection circuit output voltage $V_D$ equal to 0.1 V with reference to the negative terminal of the power source will be generated in the capacitor $C_1$ and the AGC voltage $V_{AGC}$ of 2.124 V including the voltage $V_D$ will be generated at the point A with reference to the negative terminal of the power source E with no signal input to the receiver. In order to keep the squelch transistor $TR_4$ in the conductive state at the time of non-signal input, a bias voltage $V_{eb4}$ of 0.6 V has to be provided from the AGC voltage between the emitter and the base of the transistor $TR_4$. Thus, the movable contact of the potentiometer $VR_1$ must be so adjusted that the resistance value $R_b'$ of the portion of the potentiometer between the end connected to the diode D and the movable terminal becomes 4.93 KΩ, in the case where the resistance $R_b$ of the potentiometer $VR_1$ is 20 KΩ.

Once the movable contact of the potentiometer $VR_1$ is adjusted as required, the transistor $TR_4$ is rendered conductive providing a large collector current which flows through the resistor $R_3$; thus, a large voltage drop is provided thereacross. Thus, a large negative emitter bias voltage $V_{e3}$ is provided at the emitter of the audio frequency amplifying transistor $TR_3$ with respect to ground. On the other hand, to the base of the transistor $TR_3$, there is provided a bias voltage $V_{b3}$, derived from division of power source voltage $V_E$ by the resistors $R_6$ and $R_7$. The resistors $R_3$, $R_6$ and $R_7$ have a value which provides an emitter bias voltage $V_{e3}$ to the emitter of the transistor $TR_3$ which becomes larger than the base bias voltage $V_{b3}$ in the negative direction with reference to ground when the squelch transistor $TR_4$ is rendered conductive by the non-signal input condition, and becomes smaller than the base bias voltage when the squelch transistor $TR_4$ is interrupted by a weak signal input. Accordingly, at the time of a non-signal input, the transistor $TR_3$ is rendered non-conductive and the squelch action becomes effective.

Figure 5:
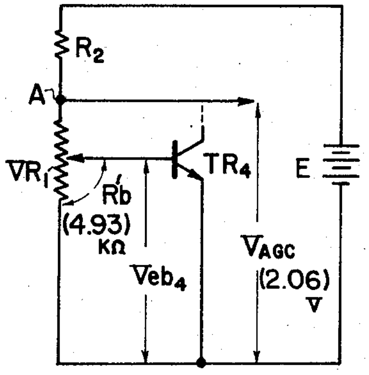

Next, the change in the squelch action will be explained for the condition wherein an input signal is supplied to the first stage transistor $TR_1$ from the transformer $T_0$ to reduce the output voltage $V_D$ of the detection circuit from 0.1 V to 0 V. Although the amount of change in $V_D$ is 0.1 V, it is apparent from the foregoing table that the AGC voltage $V_{AGC}$ only changes from 2.124 to 2.06 V. However, the bias voltage $V_{eb4}$ between the emitter and the base of the squelch transistor $TR_4$ is made up of the output voltage $V_D$ of the detection circuit added to the voltage drop due to the part $R_b'$ of the resistance value $R_b$ in the potentiometer $VR_1$. Therefore, the equivalent circuit at the time of the above-described signal input is as shown in FIG. 5. Under these conditions, $V_{eb4}$ becomes 0.507 V, which is the proportion of $V_{AGC}$ across the resistance portion $Rb'$. This means that a change in $V_D$ by 0.1 V causes a change in $V_{eb4}$ of 0.093 V, reducing the bias of transistor $TR_4$ to a value below its cut-off.

Accordingly, the squelch transistor $TR_4$ is immediately cut off to reduce the voltage drop across the resistor $R_3$, and the audio frequency signal amplifying transistor $TR_3$ once again operates under normal conditions. Therefore, according to the present invention, even if a small change of about 0.1 V occurs in the output voltage of the detection circuit by the arrival of a small signal input to the receiver, the squelch circuit 7 is cut off, so as to permit normal operation of the audio frequency amplifier circuit.

The strength of the input signal sufficient to provide the necessary change of about 0.1 V in the detection output may be small depending upon the design of the preceding circuit.

For the transistor $TR_3$ in the above-described embodiment, the Hitachi germanium PNP-type transistor 2SB-75 was used. In order to switch this transistor from the conductive state to the cut-off state, it is easier to change the emitter potential to be more negative than the base potential by causing a current to flow to the emitter resistor $R_3$, as described above, than to change the potential of the base of the transistor. However, a silicon NPN-type transistor 2SC 458 can also be used as a transistor $TR_3$. In such a case, transistors $TR_1$ through $TR_4$ can be made up of the same conductivity type transistors.

The transistor 2SC 458 has, as described above, a very sharp cut-off characteristic for the collector current with variation of base bias voltage, so that a large conductive collector current from the squelch transistor $TR_4$ is caused to flow to a part of the bias controlling resistor $R_6$ for the audio frequency signal amplifying transistor $TR_3$, and the base bias voltage of the transistor $TR_3$ is made to be close to ground potential, so as to keep the transistor $TR_3$ in a cut-off state.

Figure 2:
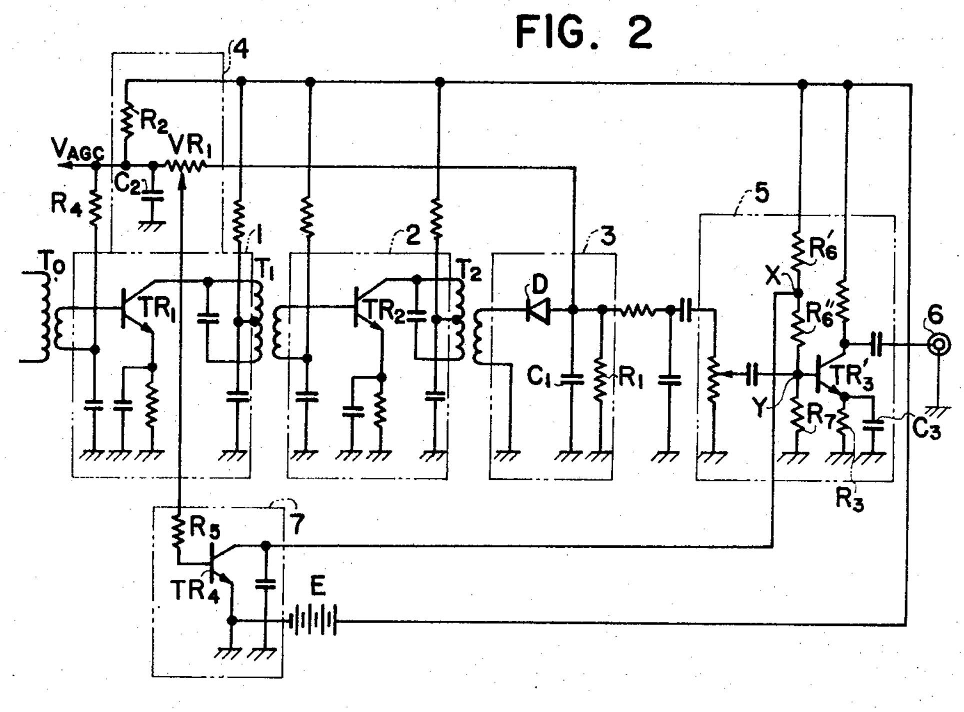

A second embodiment of the present invention is illustrated in FIG. 2. The circuit of this embodiment has the negative terminal of the power source E grounded, but is basically the same as the circuit of FIG. 1. Therefore, similar elements in the respective circuits have been indicated by corresponding reference numerals.

As is apparent from FIG. 2, in the second embodiment of the present invention, the bleeder resistor $R_6$ is made up of two resistors $R'_6$ and $R''_6$, which resistors are connected in series with the resistor $R_7$ to the power source E, point of connection X of the resistors $R'_6$ and $R''_6$ being connected to the collector of the squelch transistor $TR_4$ and the point of connection Y of the resistors $R''_6$ and $R_7$ being connected to the base of the NPN-type transistor $TR'_3$ for amplifying the audio frequency signal.

When the squelch transistor $TR_4$ is conducting, the resistance between the emitter and the collector at that time becomes quite small, and thus the potential of the point X is lowered. Accordingly, the base bias voltage of the transistor $TR'_3$ obtained by dividing the potential between the resistors $R''_6$ and $R_7$ is also lowered. Therefore, the values of the resistors $R'_6$, $R''_6$ and $R_7$, are, respectively, so selected that the base bias voltage of the transistor $TR'_3$ becomes lower than the cut-off voltage thereof at the time of conducting of the transistor $TR_4$ and higher than the cut-off voltage at the time that the transistor $TR_4$ is cut off. Therefore, the squelch circuit is turned on at the time of non-signal input and is turned off at the time of signal input.

While we have shown and described two embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. In a radio receiver having a power source, a gain controllable intermediate frequency amplifying circuit for operatingly amplifying an intermediate frequency signal containing an audio frequency signal to be detected, a signal detection circuit connected to the output of said intermediate frequency amplifying circuit and including at least a detection diode, a resistor and a capacitor connected together in parallel, and an intermediate frequency transformer having a secondary winding connected in series with said diode across said parallel circuit of said resistor and said capacitor and a primary winding connected to the output of said intermediate frequency amplifying circuit, so that the audio frequency signal is separated from the intermediate frequency signal and appears across said parallel circuit, a time constant circuit including at least a potentiometer having an adjustable terminal and a time constant resistor connected in series with said signal detection circuit to said power source so that the audio frequency signal appearing across the parallel circuit inversely varies the potential at the junction between said potentiometer and said time constant resistor, and a time constant capacitor connected to said junction to provide a time constant, so that an automatic gain control voltage variable in response to the amplitude of the audio frequency signal thus separated is obtained across said time constant capacitor, said junction being connected to the input of said amplifying circuit, the amplification factor of which is inversely controlled by application thereto of the automatic gain control voltage, so that its output is successively transferred to said detection circuit, and an audio frequency amplifying circuit connected to said detection circuit for amplifying the audio frequency signal output of the detection circuit, an improved squelch circuit comprising: a squelch transistor; a biasing circuit including connecting means for connecting the adjustable terminal of said potentiometer to the base of said squelch transistor for providing between the base and emitter of said squelch transistor a bias voltage, which bias voltage is so determined by adjustment of said potentiometer that the conductivity state of the squelch transistor is provided only during a non-signal input condition of the receiver; and means for varying the bias voltage of the audio frequency amplifying circuit in response to change in the conductivity state of the squelch transistor so that the audio frequency amplifying circuit is conducting only when an audio frequency signal is detected by the detection circuit.

2. The combination defined in claim 1, wherein the emitter of said squelch transistor is connected to said power source along with said parallel circuit so that the bias voltage on said squelch transistor is variable with changes in the audio frequency signal across said parallel circuit.

3. The combination defined in claim 2, wherein said means for varying the bias voltage of said audio frequency amplifying circuit includes a bias resistor in said audio frequency amplifying circuit connected to the collector of said squelch transistor for cutting-off said audio frequency amplifying circuit when said squelch transistor is conductive.

4. The combination defined in claim 3, wherein said audio frequency amplifying circuit includes an audio amplifying transistor having an emitter connected to said bias resistor and a base connected to a voltage divider circuit which is connected to said power source, said voltage divider circuit providing a bias to said base which is larger than said emitter bias when said squelch transistor is non-conductive and is smaller than said emitter bias when said squelch transistor is conductive.

5. In a radio receiver including a power source, a gain controllable intermediate frequency amplifying circuit for operatingly amplifying an intermediate frequency signal containing an audio frequency signal to be detected, a signal detection circuit including at least a diode, a resistor and a capacitor connected together in parallel, and an intermediate frequency transformer having a primary winding connected to the output of said intermediate frequency amplifying circuit and a secondary winding connected in series with said diode across the parallel circuit of said resistor and said capacitor, so that an output signal is obtained across said parallel circuit, an automatic gain control circuit including a time constant resistor, a time constant capacitor, and a potentiometer having an adjustable terminal, said time constant resistor and said potentiometer being connected in series with said parallel circuit across said power source, said time constant capacitor being connected at one end thereof to a junction between said time constant resistor and said potentiometer and at the other one end thereof to one polarity terminal of said power source, said power source being directed in such a manner that it normally biases said diode forwardly, and an audio frequency amplifying circuit for amplifying the output signal of said signal detection circuit, an improved squelch circuit comprising:

a squelch transistor having emitter, base and collector, the emitter-collector circuit being connected across said power source;

bias means for biasing said squelch transistor to the conductive or non-conductive side of its operating characteristic during a non-signal input or a signal input condition of the receiver, respectively, said biasing means including connecting means for connecting the adjustable terminal of said potentiometer to the base of said squelch transistor; and means for varying the conductivity of said audio frequency amplifying circuit inversely to the change in the conductivity of said squelch transistor.

6. The combination defined in claim 5, wherein said means for varying the conductivity of said audio frequency amplifying circuit includes a bias resistor in said audio frequency amplifying circuit connected to the collector of said squelch transistor for cutting off said audio frequency amplifying circuit when said squelch transistor is conductive.

7. The combination defined in claim 6, wherein said audio frequency amplifying circuit includes an audio amplifying transistor having an emitter connected to said bias resistor and a base connected to a voltage divider circuit which is connected to said power source, said voltage divider circuit providing a bias to said base which is larger than said emitter bias when said squelch transistor is non-conductive and is smaller than said emitter bias when said squelch transistor is conductive.

8. In a radio receiver having a. a power source, b. a gain controllable intermediate frequency amplifier for operatingly amplifying an intermediate frequency signal applied thereto which contains an audio frequency signal to be detected, c. a signal detector including a diode, an intermediate frequency transformer having a primary coil coupled to an output terminal of said intermediate frequency amplifier and a secondary coil connected in series to said diode, a smoothing circuit coupled to said secondary coil through said diode, so that the audio frequency signal is separated from the intermediate frequency signal and appears across said smoothing circuit, d. an automatic gain control circuit including a potentiometer having a movable contact and connected in series with one electrode of said power source through said smoothing circuit as well as a series circuit formed by said secondary coil and said diode, and a time constant circuit connected between said potentiometer and the other one electrode of said power source so that said diode is normally biased forwardly by said power source and backwardly by an audio frequency signal appearing across said smoothing circuit, a junction point between said potentiometer and said time constant circuit at which an automatic gain control voltage is obtained being coupled to an input terminal of said intermediate frequency amplifier, so that the gain of said intermediate frequency amplifier is controlled by the automatic gain control voltage, and e. an audio frequency amplifier coupled to said signal detector for amplifying the audio frequency signal applied from said signal detector, an improved squelch circuit comprising:

a squelch transistor which is operable in on and off states and operatingly drives said audio frequency amplifier to off and on states, respectively;

first connecting means for connecting the movable contact of said potentiometer to a base of said squelch transistor;

second connecting means for connecting an emitter of said squelch transistor to the other electrode of said power source, so that a bias voltage is provided between the emitter and the base of said squelch transistor, said bias voltage being so determined by adjustment of a position of the movable contact of said potentiometer that the bias voltage has a value larger than a threshold voltage of said squelch transistor unless the audio frequency signal of an intensity larger than a desired intensity appears across said smoothing circuit.

9. The combination as defined in claim 8, which further includes a bias resistor for said audio frequency amplifier connected to a collector of said squelch transistor so as to allow collector current to flow therethrough to thereby operatingly cut off said audio frequency amplifying circuit when said squelch transistor is conductive.

10. The combination as defined in claim 9, which further includes a bypass capacitor connected in parallel with said bias resistor and connected to the collector of said squelch transistor.

11. The combination as defined in claim 9, wherein said audio frequency amplifier includes an audio frequency signal amplifying transistor having an emitter connected to said bias resistor and a base connected to a voltage divider circuit which is connected to said power source, said voltage divider circuit providing a bias to the base of said audio frequency signal amplifying transistor which is larger than said emitter bias when said squelch transistor is conductive.

* * * * *